United States Patent
Kanno et al.

(10) Patent No.: US 8,279,655 B2
(45) Date of Patent: Oct. 2, 2012

(54) NON-VOLATILE SEMICONDUCTOR MEMORY DEVICE AND METHOD OF CONTROLLING NON-VOLATILE SEMICONDUCTOR MEMORY DEVICE

(75) Inventors: Hiroshi Kanno, Mie (JP); Takayuki Tsukamoto, Mie (JP); Takahiko Sasaki, Tokyo (JP); Takafumi Shimotori, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 107 days.

(21) Appl. No.: 12/885,013

(22) Filed: Sep. 17, 2010

(65) Prior Publication Data

US 2011/0199811 A1 Aug. 18, 2011

(30) Foreign Application Priority Data

Feb. 15, 2010 (JP) ................................. 2010-030496

(51) Int. Cl.
*G11C 11/00* (2006.01)
*G11C 29/04* (2006.01)

(52) U.S. Cl. ....................................... 365/148; 365/200

(58) Field of Classification Search .................. 365/148, 365/163, 200

See application file for complete search history.

(56) References Cited

U.S. PATENT DOCUMENTS

| 7,894,238 B2* | 2/2011 | Shinozaki ...................... 365/148 |
| 2008/0212359 A1* | 9/2008 | Muraoka et al. .............. 365/148 |
| 2010/0142256 A1* | 6/2010 | Kumar et al. .................. 365/148 |
| 2011/0063887 A1* | 3/2011 | Kanda ........................... 365/148 |

FOREIGN PATENT DOCUMENTS

| JP | 2006-179560 | 7/2006 |
| JP | 2006-179582 | 7/2006 |
| JP | 2008-282499 | 11/2008 |
| JP | 2008-300011 | 12/2008 |
| WO | WO 2007/088626 A1 | 8/2007 |

OTHER PUBLICATIONS

U.S. Appl. No. 13/043,681, filed Mar. 9, 2011, Kurosawa, et al.
U.S. Appl. No. 13/051,312, filed Mar. 18, 2011, Sasaki, et al.
U.S. Appl. No. 13/181,949, filed Jul. 13, 2011, Kamoshida, et al.

* cited by examiner

*Primary Examiner* — Anh Phung
(74) *Attorney, Agent, or Firm* — Oblon, Spivak, McClelland, Maier & Neustadt, L.L.P.

(57) ABSTRACT

According to an embodiment, there are provided a non-volatile semiconductor memory device includes: a memory cell array; a control circuit performing a series of operations to each memory cell and determining, as a defective memory cell, a memory cell whose data retention property does not satisfy a criteria, the series of operations including an operation applying a first bias to the memory cell in a forward direction, and including an operation thereafter applying a second bias to the memory cell in a reverse direction; a storage unit storing an address of the defective memory cell; and an address control unit performing a control to avoid storing data in the defective memory cell whose address is stored in the storage unit.

20 Claims, 8 Drawing Sheets

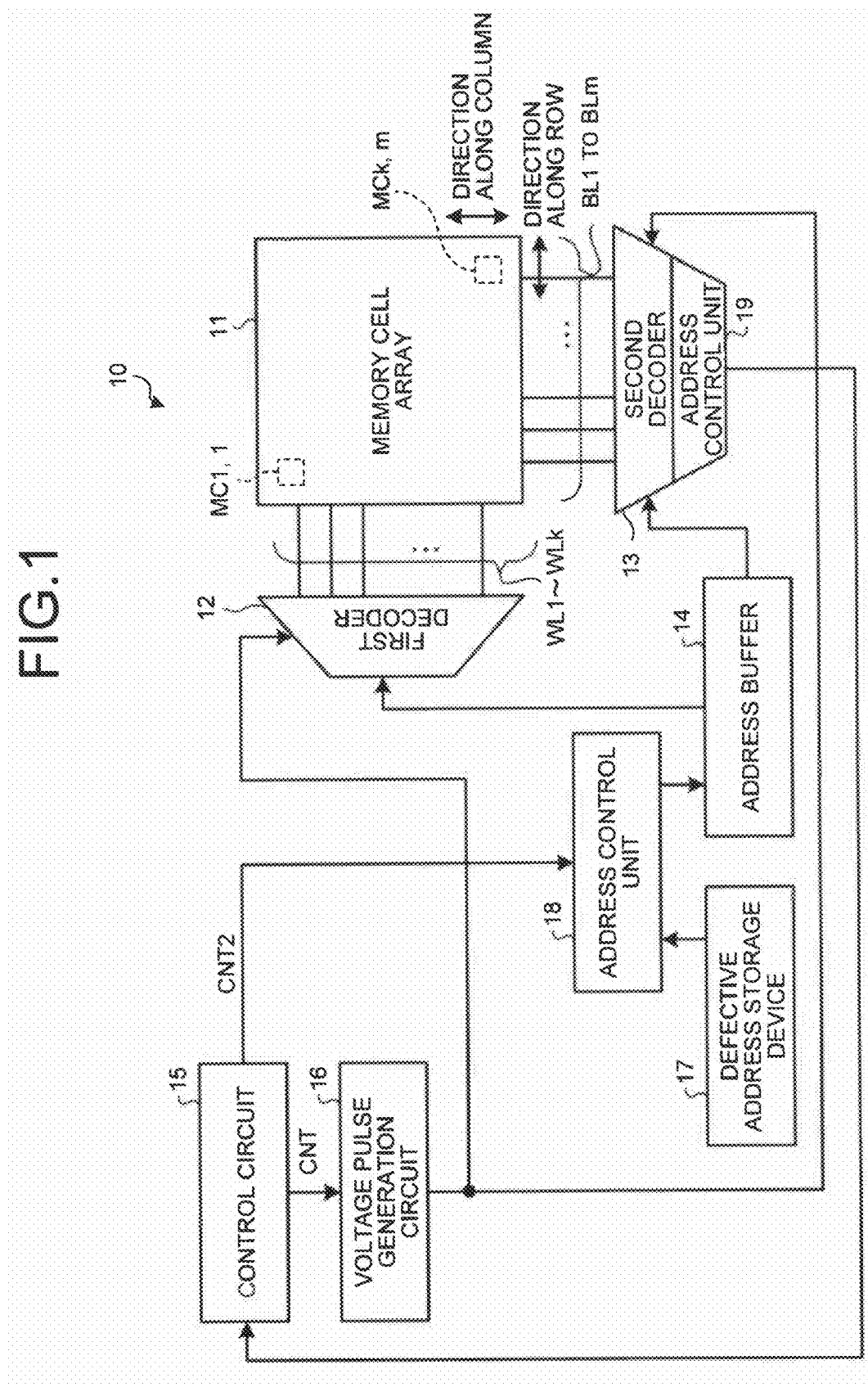

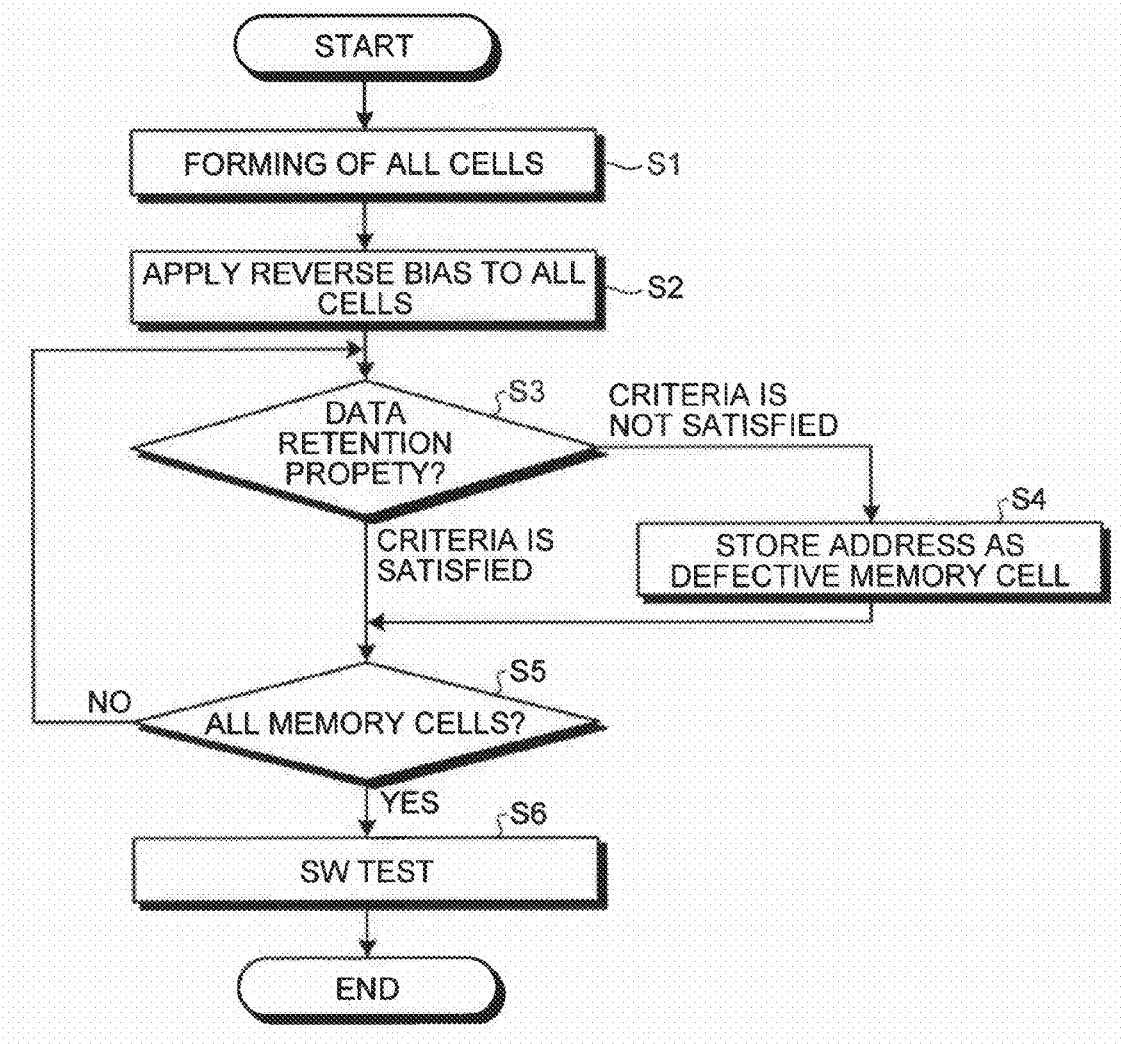

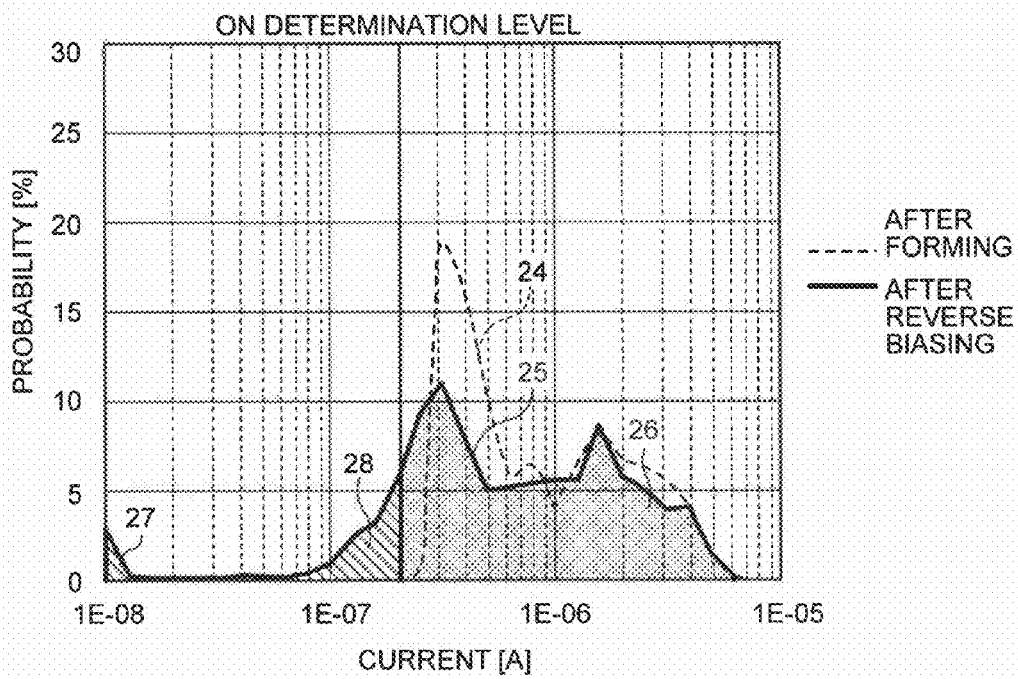
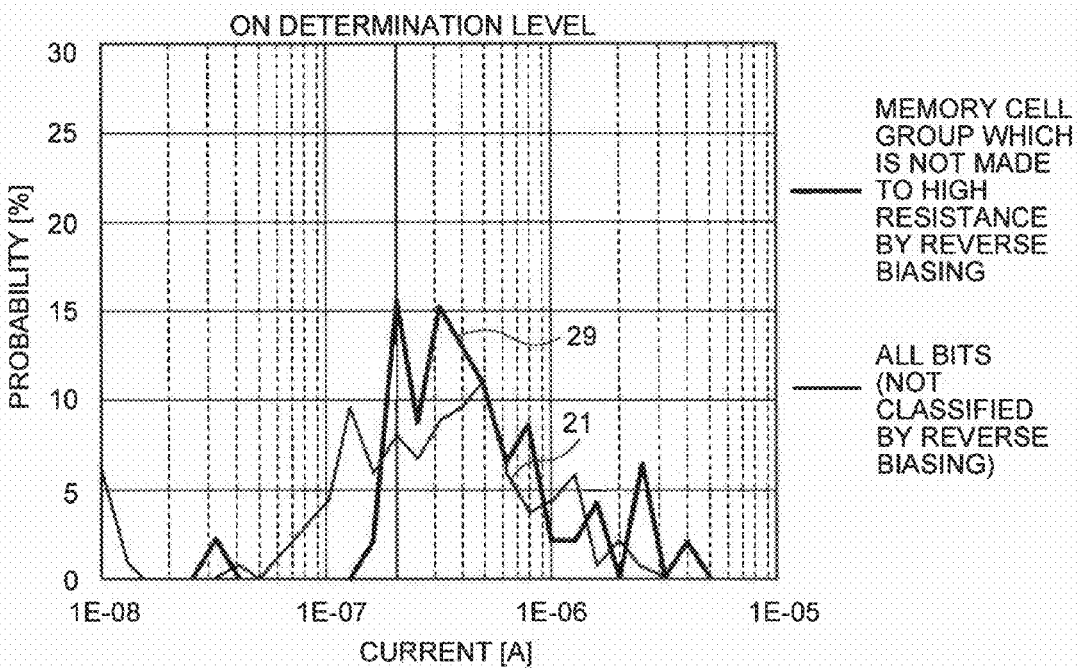

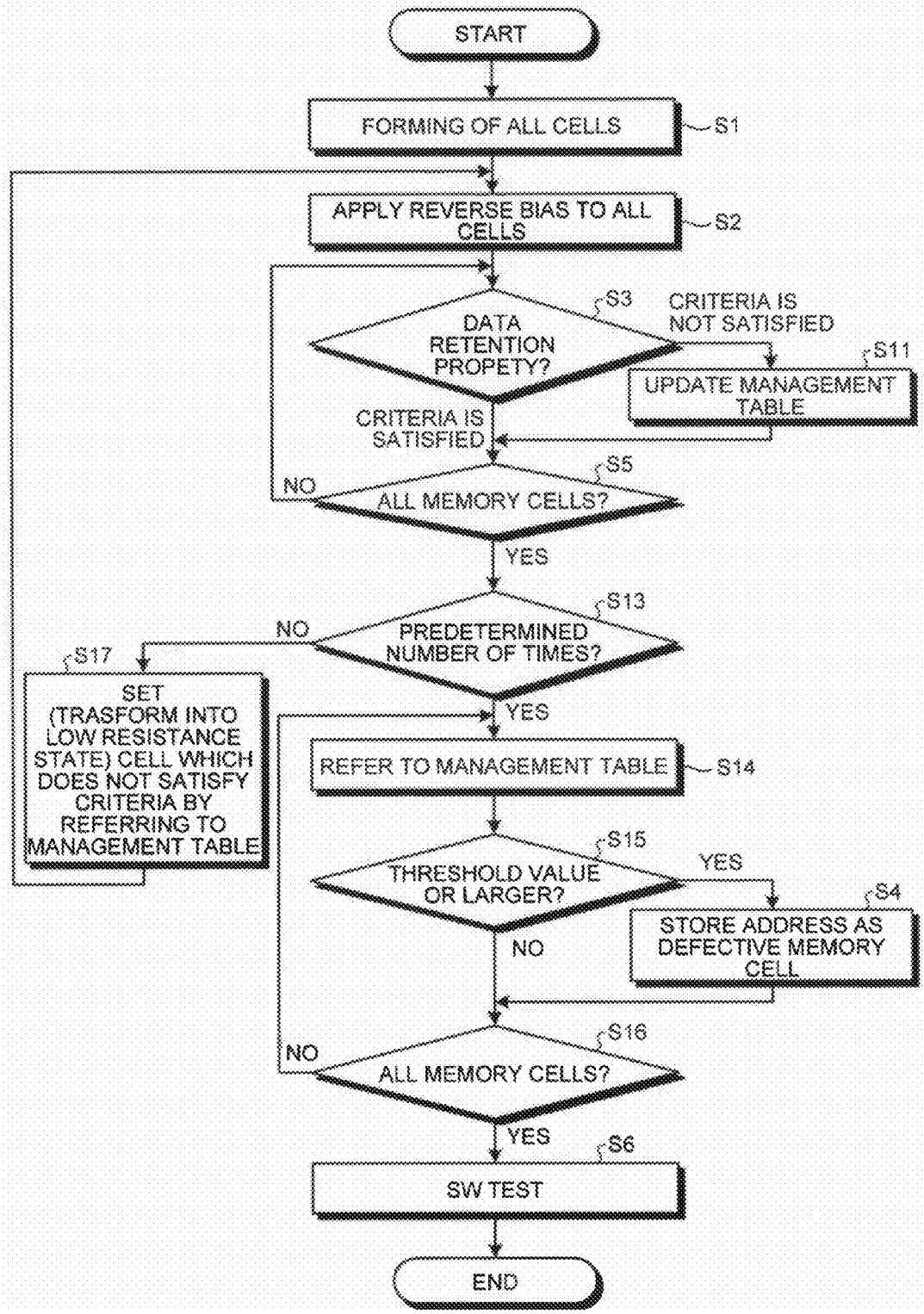

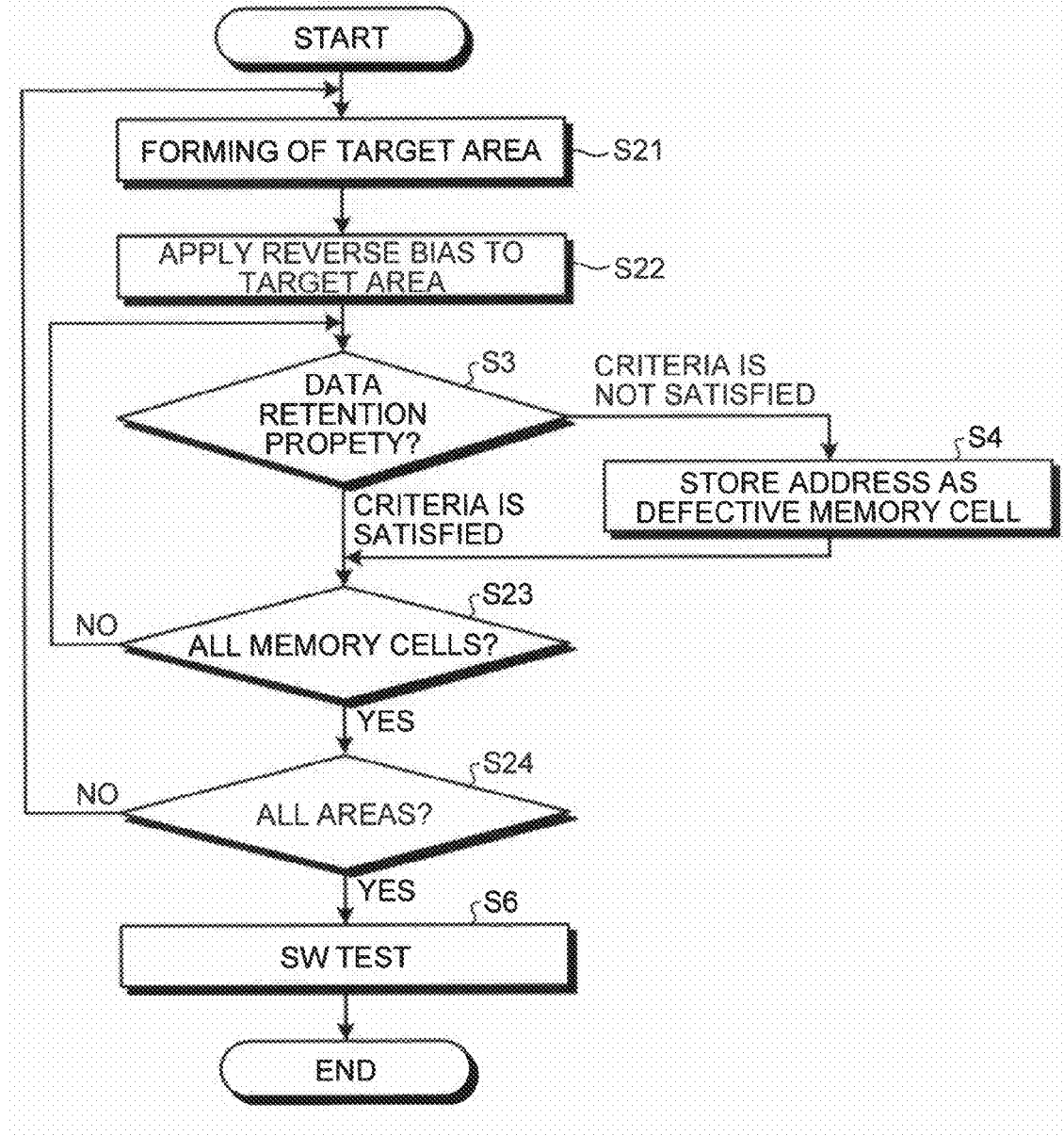

NON-VOLATILE SEMICONDUCTOR MEMORY DEVICE AND METHOD OF CONTROLLING NON-VOLATILE SEMICONDUCTOR MEMORY DEVICE

CROSS-REFERENCE TO RELATED APPLICATIONS

This application is based upon and claims the benefit of priority from Japanese Patent Application No. 2010-030496, filed on Feb. 15, 2010; the entire contents of which are incorporated herein by reference.

FIELD

Embodiments described herein relate generally to a non-volatile semiconductor memory device and a method of controlling the non-volatile semiconductor memory device.

BACKGROUND

It is known that a variable resistance element used in a resistive random access memory has two types of configurations. In one configuration (the variable resistance element), a high resistance state and a low resistance state is set by switching a polarity of a voltage to be applied thereto and the configuration is called a bipolar type variable resistance element. In the other configuration (the variable resistance element), a high resistance state and a low resistance state can be set by controlling a value and an application time of a voltage to be applied thereto without switching a polarity of an applied voltage and the configuration is called a unipolar type variable resistance element.

In a resistive random access memory using the unipolar type variable resistance elements, a memory cell array is configured such that variable resistance elements and rectifying elements such as diodes and the like are arranged between bit lines and word lines at intersecting positions of the bit lines and the word lines. Further, when the memory cell arrays are stacked three-dimensionally, a memory cell array having a large capacity can be realized without using a cell transistor and without increasing an area of the memory cell array.

In the unipolar type resistive random access memory (ReRAM), data is written to a memory cell by applying a predetermined voltage to a variable resistance element for a predetermined time. With the operation, the variable resistance element changes from a high resistance state to a low resistance state (or from the low resistance state to the high resistance state). The data write operation to the memory cell is called a set operation.

In contrast, data is erased from the memory cell by applying a voltage lower than the predetermined voltage to the resistance change element in the low resistance state for a predetermined time after data is written thereto. With the operation, the variable resistance element changes from the low resistance state to the high resistance state (or from the high resistance state to the low resistance state). The data erase operation to the memory cell is called a reset operation.

To use the resistive random access memory device as a non-volatile memory device, it is necessary that respective memory cells hold data (low resistance state or high resistance state) for a long time.

To obtain practically usable reliability of the resistive random access memory device as a non-volatile memory device (non-volatile semiconductor memory device), a management must be performed to detect a memory cell whose data retention property does not satisfy a criteria at an early stage and to determine the memory cell as a defective memory cell. However, an inefficient method of actually measuring a variation per hour of a resistance state for a long time has been used to determine the defective memory cell.

BRIEF DESCRIPTION OF THE DRAWINGS

FIG. 1 is a block diagram showing a configuration of a non-volatile semiconductor memory device according to a first embodiment;

FIG. 3 is a flowchart showing a method of controlling the non-volatile semiconductor memory device according to the first embodiment;

FIG. 4 is a graph showing a distribution of a read current value after a forming operation and a distribution of a read current value after a reverse biasing operation;

FIG. 5 is a graph showing a distribution of a read current value of a memory cell group whose resistance is not increased by the reverse biasing operation in two hours after a switching operation;

FIG. 6 is a flowchart showing a method of controlling a non-volatile semiconductor memory device according to a second embodiment;

FIG. 7 is a flowchart showing a method of controlling a non-volatile semiconductor memory device according to a third embodiment;

DETAILED DESCRIPTION

Figure 2A:
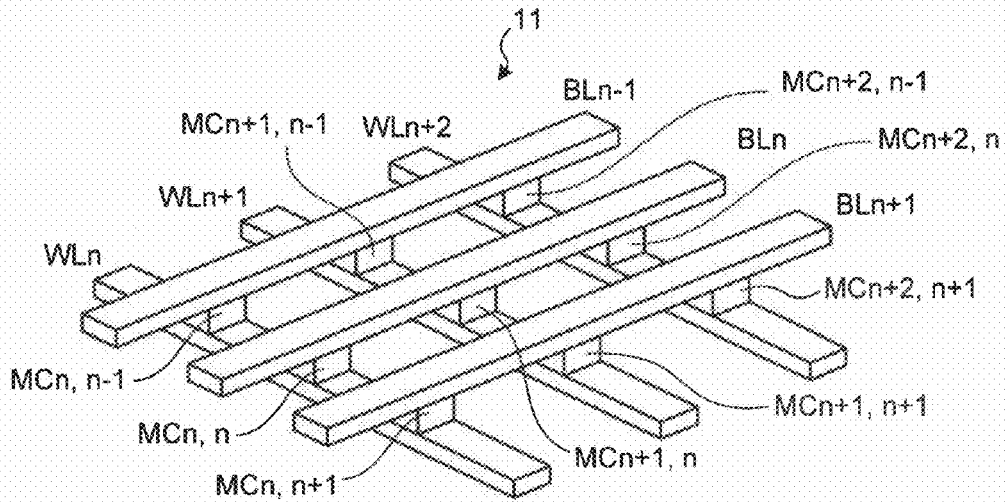
FIG. 2A and FIG. 2B are views showing a configuration of a memory cell array in the first embodiment.

According to one embodiment, there is provided a non-volatile semiconductor memory device comprising: a memory cell array in which a plurality of memory cells are arranged, each of the plurality of memory cells having a resistance change element and a rectifying element connected in series to the resistance change element; a control circuit performing a series of operations to each of the plurality of memory cells and determining, as a defective memory cell, a memory cell whose data retention property does not satisfy a criteria, the series of operations including an operation applying a first bias where the rectifying element is biased to the memory cell in a forward direction, and including an operation thereafter applying a second bias where the rectifying element is biased to the memory cell in a reverse direction; a storage unit storing an address of the defective memory cell; and an address control unit performing a control to avoid storing data in the defective memory cell whose address is stored in the storage unit.

Non-volatile semiconductor memory devices according to embodiments will be explained below in detail referring to the accompanying drawings. Note that the invention is by no means limited by these embodiments.

[First Embodiment]

A non-volatile semiconductor memory device 10 according to a first embodiment will be explained using FIG. 1. FIG. 1 is a block diagram showing a configuration of the non-volatile semiconductor memory device 10 according to the first embodiment. The non-volatile semiconductor memory device 10 is, for example, a ReRAM device using the unipolar type variable resistance elements, that is, a resistive random access memory device.

The non-volatile semiconductor memory device 10 includes a memory cell array 11, a defective address storage device (storage unit) 17, a control circuit 15, an address control unit 18, an address buffer 14, a first decoder 12, a second decoder 13, a detection circuit 19, and a voltage pulse generation circuit 16.

In the memory cell array 11, a plurality of non-volatile memory cells MC1, 1-MCk, m (k, m are a natural number equal to or larger than 2, respectively) are arranged in a direction along a row and in a direction along a column (in a two-dimensional state). The plurality of non-volatile memory cells MC1, 1-MCk, m are arranged at intersecting portions of a plurality of row lines WL1-WLk and a plurality of column lines BL1-BLm. More specifically, the non-volatile semiconductor memory device 10 is, for example, a so-called crosspoint type resistive random access memory.

As shown in FIG. 2A, a plurality of row lines WLn-WLn+2, which are arranged in parallel in the direction along the row, and a plurality of column lines BLn−1-BLn+1, which are arranged in parallel in the direction along the column, face so as to intersect with one another.

In respective intersecting portions, non-volatile memory cells MCn, n−1-MCn+2, n+1 are arranged between row lines and column lines. In the following description, the row lines are called word lines and the column lines are called bit lines in conformity with an ordinary MOS type memory cell. The word lines WLn-WLn+2 and the bit lines BLn−1-BLn+1 have a pitch set to, for example, 44 nm, respectively. More specifically, each of the word lines WLn-WLn+2 and the bit lines BLn−1-BLn+1 is configured of, for example, a 22 nm wide line and a 22 nm space. A cross section of the respective memory cell MCn, n−1-MCn+2, n+1 is set to, for example, 22 nm×22 nm in a arrangement direction of the plurality of non-volatile memory cells MC1, 1-MCk, m.

Figure 2B:
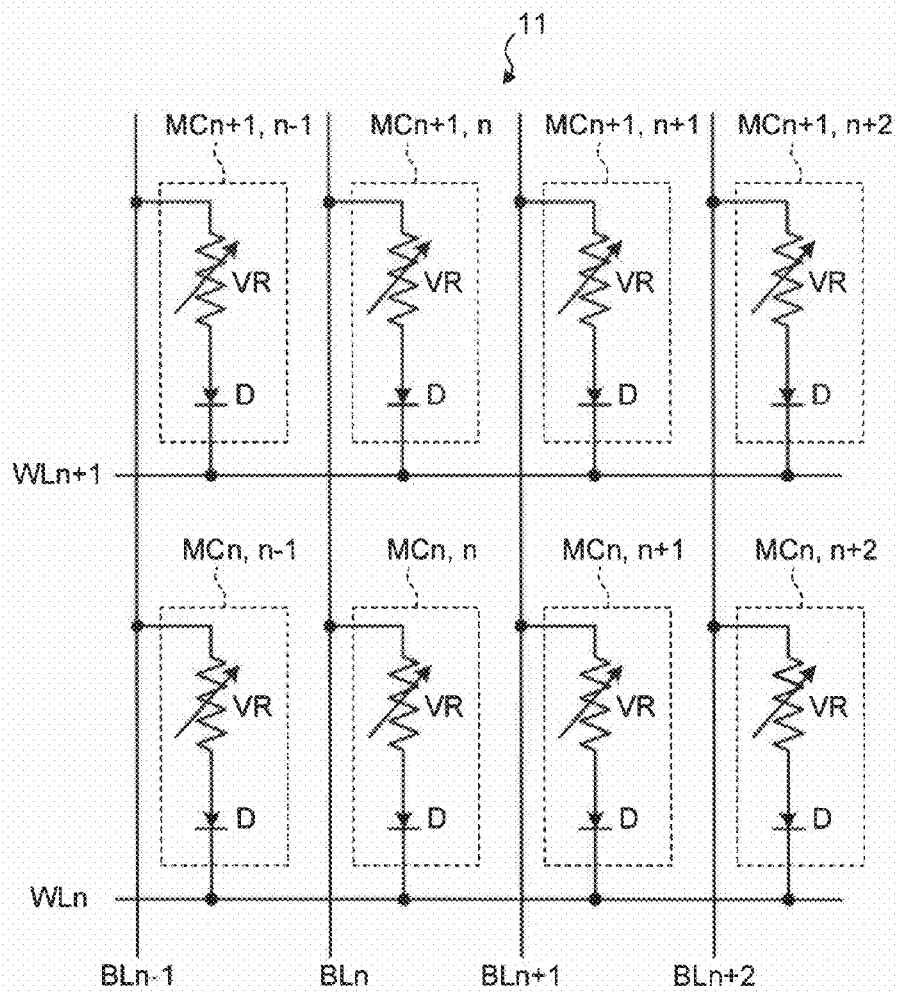

In respective non-volatile memory cells MCn, n−1-MCn+1, n+2, as shown in FIG. 2B, a resistance change element VR is connected in series to a diode (rectifying element) D. In the non-volatile semiconductor memory device 10, to prevent a problem of a disturbance and a drop of sensitivity caused by a sneak current generated at the time of read/write/erase, the diode D as a non-ohmic element is connected in series the resistance change element VR.

Note that, although FIG. 2B exemplifies a case that, in the respective non-volatile memory cells, a direction from the bit lines to the word lines via the non-volatile memory cells becomes a forward direction of the diode D, the direction from the bit lines to the word lines via the non-volatile memory cells may become a reverse direction of the diode D. Further, although FIG. 2B exemplifies a case that, in the respective non-volatile memory cells, the resistance change element VR is arranged on the bit line side and the diode D is arranged on the word line side, the diode D may be arranged on the bit line side and the resistance change element may be arranged on the word line side.

The resistance change element VR is an element which transits between at least two resistance value states, for example, between two resistance value states of a low resistance state and a high resistance state. A resistance value state can be caused to transit (can be switched) by applying a voltage pulse having a predetermined magnitude and width to both the ends of the respective non-volatile memory cell in the forward direction or in the reverse direction of the diode.

For example, data is written to a non-volatile memory cell by applying a predetermined voltage to the resistance change element VR for a predetermined time. More specifically, a bias (first bias) which is in the forward direction to the diode D is applied to both the ends of the non-volatile memory cell. With the operation, the resistance change element VR changes from the high resistance state to the low resistance state. The operation for changing the resistance change element VR from the high resistance state to the low resistance state is called a set operation.

In contrast, data is erased from the non-volatile memory cell by applying a voltage lower than the predetermined voltage to the resistance change element VR in the low resistance state for a predetermined time after data is written thereto. With the operation, the resistance change element VR changes from the low resistance state to the high resistance state. The operation for changing the resistance change element VR from the low resistance state to the high resistance state is called a reset operation.

The control circuit 15 shown in FIG. 1 outputs a control signal CNT for permitting a generation of a voltage pulse to the voltage pulse generation circuit 16 at the time of forming/read/write (set)/erase (reset) operations. The control circuit 15 outputs a control signal CNT2 for instructing to generate an address signal at the time of the forming/read/write/erase operations to the address control unit 18. Further, the control circuit 15 determines whether a non-volatile memory cell to be read is in the high resistance state, in the low resistance state, or in a transition state at the time of the read based on a signal from the detection circuit 19.

The voltage pulse generation circuit 16 receives the control signal CNT from the control circuit 15. The voltage pulse generation circuit 16 generates a voltage pulse having a predetermined magnitude (voltage value) and a predetermined width (duration) in response to the control signal CNT. The voltage pulse generation circuit 16 supplies the generated voltage pulse to the first decoder 12 and the second decoder 13, respectively.

The first decoder 12 is arranged to one end side in the direction along the row with respect to the memory cell array 11. The first decoder 12 supplies the voltage pulse received from the voltage pulse generation circuit 16 to a word line selected in response to the voltage pulse supplied from the voltage pulse generation circuit 16.

The second decoder 13 is arranged to one end side in the direction along the column with respect to the memory cell array 11. The second decoder 13 supplies the voltage pulse received from the voltage pulse generation circuit 16 to a bit line selected in response to the voltage pulse supplied from the voltage pulse generation circuit 16. At the time, a plurality of non-selected word lines and a plurality of non-selected bit lines are set to a constant fixed potential.

The detection circuit 19 is accompanied to the second decoder 13, has a function for detecting a resistance value of a non-volatile memory cell selected at the time of read, and sends a result of detection to the control circuit. With the operation, the control circuit 15 controls a series of operations via the voltage pulse generation circuit 16, the first decoder 12, and the second decoder 13. The series of operations include a operation for applying a predetermined voltage pulse to both the ends of the non-volatile memory cell, a operation for determining whether or not the non-volatile memory cell is placed in a desired state in the read operation performed thereafter, and a operation for applying a voltage pulse again when the control circuit 15 determines that the non-volatile memory cell is not set in the desired state.

The defective address storage device 17 receives address information of a defective memory cell from the control circuit 15 by a defective memory cell determination method (control method) to be described later. With the operation, the defective address storage device 17 stores addresses of a plurality of defective memory cells determined by the control circuit 15, respectively.

The address control unit 18 generates an address signal for designating an address of a non-volatile memory cell in the memory cell array 11 to which the voltage pulse is supplied in response to the control signal CNT2 supplied from the control circuit 15. At the time, the address control unit 18 refers to the defective address storage device 17 and generates an address signal for designating addresses which are determined so as to avoid the addresses of the defective memory cells stored in the defective address storage device 17. More specifically, the address control unit 18 performs a control to store data in the non-volatile memory cells in the memory cell array 11 so as to avoid the addresses of the plurality of defective memory cells stored in the defective address storage device 17. In other words, the address control unit 18 performs a management so as not to store data to the addresses of the plurality of defective memory cells stored in the defective address storage device 17 (that is, so as not to perform the write (set) or the erase (reset) operations). Further, at the time of read operation, the address control unit 18 performs a control to read data from the addresses excluding the addresses of the plurality of defective memory cells stored in the defective address storage device 17 in the memory cell array 11.

At the time of read/write/erase operations, an address signal is input to the address buffer 14 from the address control unit 18. A part of the address signal (a portion showing a row address) is input from the address buffer 14 to the first decoder 12, and the other portion of the address signal (a portion showing a column address) is input from the address buffer 14 to the second decoder 13.

The first decoder 12 receives the address signal from the address control unit 18 via the address buffer 14. The first decoder 12 selects one of the plurality of word lines WL1-WLk in response to the address signal (i.e. by decoding the address signal). More specifically, the first decoder 12 designates a row address of a non-volatile memory cell to be accessed in response to the address signal.

The second decoder 13 receives the address signal from the address control unit 18 via the address buffer 14. The second decoder 13 selects one of the plurality of bit lines BL1-BLm in response to the address signal (i.e. by decoding the address signal). More specifically, the second decoder 13 designates a column address of the non-volatile memory cell to be accessed in response to the address signal.

The voltage pulse generation circuit 16 receives the control signal CNT from the control circuit 15. The voltage pulse generation circuit 16 generates the voltage pulse having the predetermined magnitude (voltage value) and the predetermined width (duration) in response to the control signal CNT. The voltage pulse generation circuit 16 supplies the generated voltage pulse to the first decoder 12 and the second decoder 13, respectively.

The first decoder 12 supplies the voltage pulse received from the voltage pulse generation circuit 16 to the selected word line. The second decoder 13 supplies the voltage pulse received from the voltage pulse generation circuit 16 to the selected bit line. At the time, the plurality of non-selected word lines and the plurality of non-selected bit lines are set to the constant fixed potential.

To use the non-volatile semiconductor memory device (resistive random access memory device) 10 as the non-volatile memory, it is indispensable that a resistance value of the resistance change element VR which is changed by causing the resistance change element VR to perform a switching operation be kept stable in terms of time. The inventors investigated a temporal alternation of a resistance value of the resistance change element VR after performing a switching operation by means of a memory array of an actually usable level.

Figure 10:
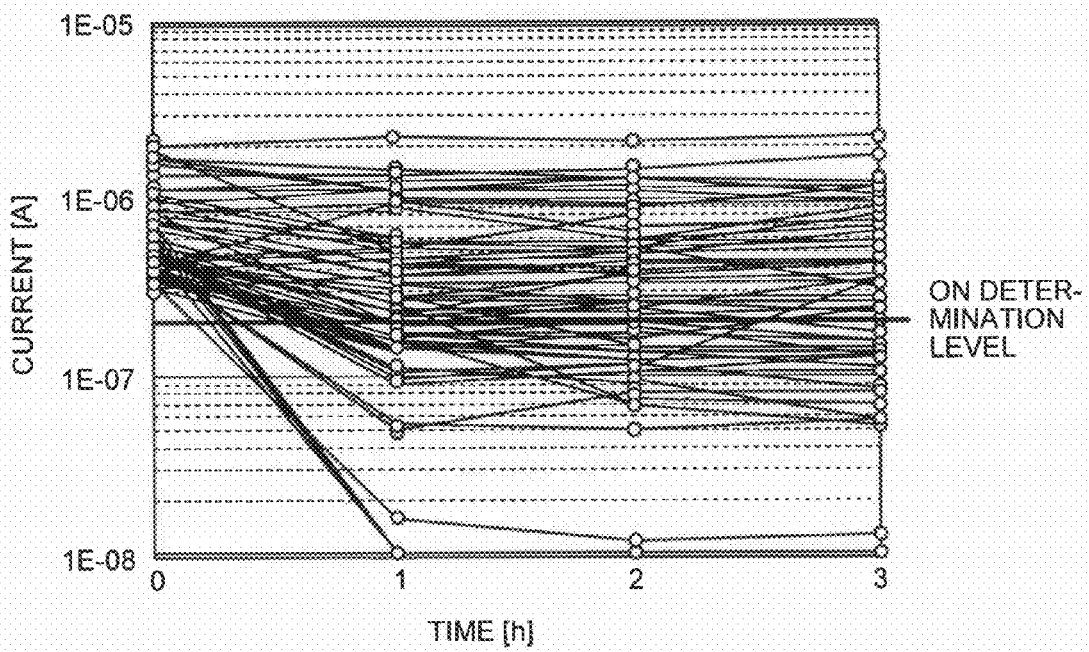
FIG. 10 is a graph showing a time dependence of read current values of a plurality of bits.

FIG. 10 is a graph in which time dependence of read current values of respective non-volatile memory cells are plotted after the respective non-volatile memory cells perform a switching operation (set operation+reset operation) multiple times and were finally stopped in a low resistance state. In the graph of FIG. 10, a lateral axis shows an elapsed time and a vertical axis shows a read current value of the memory cells. In the graph of FIG. 10, an ON determination level is a level acting as a criteria for determining that data retention property does not satisfy the criteria. When the read current value is equal to or less than the ON determination level, it is determined that data retention property of a non-volatile memory cell correspond to the read current value does not satisfy the criteria (that is, when a low resistance state is to be held, the low resistance state cannot be held and the low resistance state changes to a high resistance state). When the read current value is more than the ON determination level, it is determined that data retention property of a non-volatile memory cell corresponding to the read current value satisfies the criteria (that is, when a low resistance state is to be held, the low resistance state is held).

As shown in FIG. 10, almost all the non-volatile memory cells in the memory cell array 11 have a small change of the read current value which is caused as a time elapses and have a stable resistance value. However, in some of the non-volatile memory cells in the memory cell array 11, the read current value is greatly reduced at a relatively early time after the set operation and reduced to a level equal to or less than the ON determination level. More specifically, it can be found that resistance values of the resistance change elements VR in the some non-volatile memory cells exceed a threshold value (a threshold for the resistance value) corresponding to the ON determination level and are placed in a high resistance state. When the non-volatile memory cells whose data retention property does not satisfy the criteria exist, since such memory cells become a factor for lowering reliability as the non-volatile memory cells, it is necessary to detect such memory cells at an early stage and to determine such memory cells to as defective memory cells to manage the defective memory cells.

Figure 11:
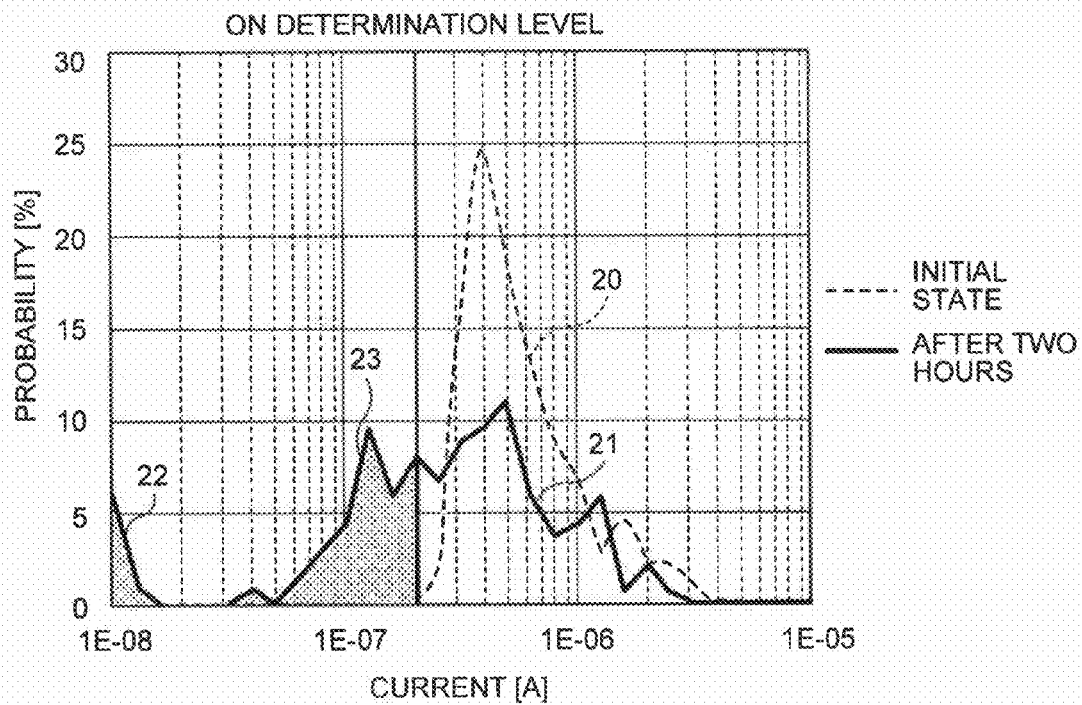
FIG. 11 is a graph showing a distribution of read current values at a time of 0 [h] and 2 [h] in FIG. 10.

FIG. 11 shows a distribution 20 of read current values in an initial state (0 hour) and a distribution 21 of the read current values after a lapse of 2 hours in FIG. 10. It can be found that the distribution 21 spreads to a low current side and there exist a memory cell group 23 whose level is slightly below the ON determination level and a memory cell group 22 whose level is largely below the ON determination level. It is necessary to detect the memory cell groups 22, 23 at an early stage, to determine the memory cells of the memory cell groups 22, 23 as the defective memory cells, and to manage the defective memory cells.

FIG. 3 is a flowchart showing a control method performed by the control circuit 15 to efficiently detect non-volatile memory cells whose data retention property does not satisfy the criteria and to determine these non-volatile memory cells as the defective memory cells. A background why the method shown in the flowchart of FIG. 3 is performed will be explained below.

Although the resistance change element VR is a high resistive insulation film in an initial state, when a predetermined voltage pulse is applied to the film, a conductive path (filament) is formed in the insulation film. The process is called forming operation. Ordinarily, the resistance change element VR after undergoing the forming operation has a resistance value corresponding to the low resistance state. A distribution 24 of read current values at the time is shown in FIG. 4.

FIG. 4 shows a distribution 25 of read current values when respective non-volatile memories in a predetermined region of a memory cell array sequentially undergo the forming operation and then a voltage which is equivalent to (for example substantially the same as) a forming voltage and which is in a reverse direction is further applied to the respective memory cells after the forming operation. It can be found that the respective non-volatile memory cells are divided to a memory cell group 26 which can hold data (resistance state) and to memory cell groups 27, 28 which cannot hold data (resistance state).

Further, concerning the memory cell group 26 which keep the low resistance state even after the reverse biasing operation is applied thereto, FIG. 5 shows a distribution 29 of read current values of the memory cell group 26 at a time when, after a switching operation (set operation+reset operation) was performed to the memory cell group 26 multiple times, two hours has elapsed from the completion of the switching operations. The current distribution 29 of FIG. 5 has good data retention properties as compared with the current distribution 21 (refer to FIG. 11) of the case where a classification was not performed by the reverse biasing operation. More specifically, it is shown that the defective memory cells whose data retention properties do not satisfy the criteria have a high possibility of being memory cells whose resistance is increased by applying the reverse bias to the memory cells after the forming operation.

Based on the above-described knowledge, the method shown in the flowchart of FIG. 3 is performed as a control method of detecting non-volatile memory cells whose data retention properties do not satisfy the criteria and determining the non-volatile memory cells as defective memory cells.

At step S1, the control circuit 15 sequentially perform forming operations of all the non-volatile memory cells MC1, 1-MCk, m (refer to FIG. 1) in the memory cell array 11. The forming operation is performed in a unit of one bit or in a unit of predetermined a plurality of bits. Among word lines WLi-WLj (i, j are a natural number equal to or larger than 1 and equal to or less than k), to which a bit to undergo the forming operation is connected is set to an L level, and bit lines BLa-BLb (a, b are a natural number equal to or larger than 1 and equal to or less than m) to which the bit to undergo the forming operation is connected is set to an H level. With this operation, the bias (first bias) which is in the forward direction to the diode D in the memory cell array 11 is applied to both the ends of the respective non-volatile memory cells. Then, the resistance change elements VR in the respective non-volatile memory cells undergone the forming operations are placed in the low resistance state.

At step S2, the control circuit 15 applies the reverse bias to all the non-volatile memory cells MC1, 1-MCk, m of the memory cell array 11 at the same time. The reverse bias can be equivalent to (for example substantially the same as) a voltage necessary to the forming operation. More specifically, all the word lines WL1-WLk are set to the H level, and all the bit lines BL1-BLm are set to the L level. With the operation, a bias (second bias) which is in the reverse direction to the diode D in the memory cell array 11 is applied to both the ends of the respective non-volatile memory cells MC1, 1-MCk, m.

At step S3, the control circuit 15 selects a non-volatile memory cell to be determined from non-selected non-volatile memory cells of the plurality of non-volatile memory cells MC1, 1-MCk, m in the memory cell array 11 and applies a predetermined read voltage to both the ends of the non-volatile memory cell to be determined. Then, the detection circuit 19 reads a current from the non-volatile memory cell to be determined, detects a resistance value of the non-volatile memory cell corresponding to the read current value, and sends a result of detection to the control circuit 15. With the operation, the control circuit 15 determines whether or not the read current value from the non-volatile memory cell is equal to or less than the ON determination level. When the read current value is more than the ON determination level, since it is considered that the resistance change element VR in the non-volatile memory cell to be determined can hold the low resistance state, it is determined that data retention property of the non-volatile memory cell to be determined satisfies the criteria ("criteria is satisfied" at S3), and a process is advanced to step S5. When the read current value is equal to or less than the ON determination level, since it is considered that the resistance change element VR in the non-volatile memory cell to be determined cannot hold the low resistance state hold, it is determined that the data retention property of the non-volatile memory cell to be determined does not satisfy the criteria ("criteria is not satisfied" at S3), and the process is advanced to step S4.

At step S4, the control circuit 15 determines, as a defective memory cell, the non-volatile memory cell to which it is determined at step S3 that the data retention property thereof does not satisfy the criteria. The control circuit 15 causes the defective address storage device 17 (refer to FIG. 1) to store an address of the thus determined defective memory cell.

At step S5, the control circuit 15 determines whether or not a determination at step S3 is performed to all the non-volatile memory cells MC1, 1-MCk, m in the memory cell array 11. When it is determined that the determination at step S3 is not performed to all the non-volatile memory cells MC1, 1-MCk, m ("No" at S5), the process is advanced to S3, whereas when it is determined that the determination at step S3 is performed to all the non-volatile memory cells MC1, 1-MCk, m ("Yes" at S5), the process is advanced to S6.

At step S6, the control circuit 15 specifies addresses of the non-volatile memory cells whose data retention properties are determined to satisfy the criteria at step S3 by referring to the addresses of the plurality of defective memory cells stored in the defective address storage device 17. With the operation, the control circuit 15 performs a test of the switching operation to the respective non-volatile memory cells whose data retention properties are determined to satisfy the criteria at step S3. More specifically, the control circuit 15 performs the set operation to the non-volatile memory cells and thereafter performs the reset operation to the non-volatile memory cells (excluding the defective memory cells).

As described above, according to the first embodiment, a series of operations which apply the bias (first bias) in the forward direction to the diode D to both the ends of a non-volatile memory cell and which thereafter apply the bias (second bias) in the reverse direction to the diode D to both the ends of the non-volatile memory cell are performed to each of the respective non-volatile memory cells in the memory cell array. With the operation, the non-volatile memory cells whose data retention properties do not satisfy the criteria can be efficiently determined as the defective memory cells at an initial stage of inspection before shipment without performing a test for a long time, and addresses of the defective memory cells can be stored in the defective address storage device 17 to allow the management of the addresses of the defective memory cells. More specifically, there can be provided the non-volatile semiconductor memory device and the method of controlling the non-volatile semiconductor memory device capable of efficiently determining the defective memory cells to manage the defective memory cells. As a result, reliability of the non-volatile semiconductor memory device (resistive random access memory) can be increased.

[Second Embodiment]

A non-volatile semiconductor memory device according to a second embodiment will be explained. Portions different from the first embodiment will be mainly explained below.

As shown in FIG. 6, a control method of the non-volatile semiconductor memory device according to the second embodiment is different from that of the first embodiment. FIG. 6 is a flowchart showing the method of controlling the non-volatile semiconductor memory device according to the second embodiment.

At step S3, when a read current value is more than the ON determination level, the control circuit 15 determines that there is a high possibility that data retention property of a non-volatile memory cell to be determined satisfies the criteria, and a process is advanced to step S5. When the read current value is equal to or less than the ON determination level, the control circuit 15 determines that there is a high possibility that the data retention property of the non-volatile memory cell to be determined does not satisfy the criteria, and the process is advanced to step S11.

At step S11, the control circuit 15 updates a management table of a number of times of determination that "the criteria is not satisfied" performed at step 3. The management table has a data structure for managing the number of times of the determination that "the criteria is not satisfied" performed at step S3 to respective non-volatile memory cells MC1, 1-MCk, m of a memory cell array 11. For example, in the management table, an address item and a 'number of times' item correspond to each other, the address item showing addresses of non-volatile memory cells, the 'number of times' item showing a number of times of the determination that "the criteria is not satisfied". The control circuit 15 refers to the management table, increments a numeral recorded in the 'number of times' item to a non-volatile memory cell to be determined, and updates the 'number of times' item by overwriting the incremented number to the item. Note that the management table may be stored in the control circuit 15 or may be stored in a defective address storage device 17. When, for example, the management table is stored in the defective address storage device 17, the control circuit 15 accesses the defective address storage device 17, reads the management table, and updates the read management table, and thereafter accesses the defective address storage device 17, and over-write-updates the table in the defective address storage device 17 by the management table updated by the control circuit 15.

At step S13, the control circuit 15 determines whether or not processes at steps of S2 to S5 are performed a predetermined number of times. When the control circuit 15 determines that the processes at steps of S2 to S5 are not performed the predetermined number of times or more ("No" at S13), the process is advanced to step S17, and the control circuit 15 applies a set pulse, that is, a set voltage (<forming voltage) to both the ends of a cell whose data retention property are not satisfied by referring to the management table and places the cell in a low resistance state again, and thereafter the process is advanced to step S2. When it is determined that the processes at steps of S2 to S5 are performed the predetermined number of times (for example, M times) or more ("Yes" at S13), the process is advanced to step S14.

At step S14, the control circuit 15 selects a non-volatile memory cell to be determined from non-selected on-volatile memory cells of the plurality of non-volatile memory cells MC1, 1-MCk, m in the memory cell array 11. Then, the control circuit 15 specifies the number of times of the determination that "the criteria is not satisfied" to the non-volatile memory cell to be determined by referring to the management table.

At step S15, the control circuit 15 determines whether or not the number of times of the determination that "the criteria is not satisfied" to the non-volatile memory cell to be determined is equal to or larger than a threshold number of times (for example, N times ($\leq$M times)). When it is determined that the number of times of the determination that "the criteria is not satisfied" is less than the threshold number of times ("No" at S15), it is determined that the data retention property is satisfied, and the process is advanced to step S16, whereas when it is determined that the number of times of the determination that "the criteria is not satisfied" is the threshold number of times or more ("Yes" at S15), it is determined that the data retention property does not satisfy the criteria, and the process is advanced to step S4.

At step S16, the control circuit 15 determines whether or not a determination at step S15 is performed to all the non-volatile memory cells MC1, 1-MCk, m in the memory cell array 11. When it is determined that the determination at step S15 is not performed to all the non-volatile memory cells MC1, 1-MCk, m ("No" at S16), the process is advanced to S14, whereas when it is determined that the determination at step S15 is performed to all the non-volatile memory cells MC1, 1-MCk, m ("Yes" at S16), the process is advanced to S6.

As described above, according to the second embodiment, a series of operations which apply a bias (first bias) which is in a forward direction to a diode D to both the ends of a non-volatile memory cell and thereafter apply a bias (second bias) which is in a reverse direction to the diode D to both the ends of the non-volatile memory cell are repeatedly performed to each of the plurality of non-volatile memory cells MC1, 1-MCk, m in the memory cell array 11 multiple times (for example, M times). When the series of operations and the determination of whether the criteria is satisfied or not are performed to each of the plurality of non-volatile memory cells multiple times, the control circuit 15 determines, as the defective memory cells, the memory cells to which it is determined that "the criteria is not satisfied" the threshold number of times or more of the plurality of non-volatile memory cells MC1, 1-MCk, m in the memory cell array 11. As a result, an accuracy when defective memory cells are determined can be improved.

[Third Embodiment]

A non-volatile semiconductor memory device according to a third embodiment will be explained. Portions different from the first embodiment will be mainly explained below.

As shown in FIG. 7, a control method of the non-volatile semiconductor memory device according to the third embodiment is different from that of the first embodiment.

At step S21, a control circuit 15 selects an area to be processed (target area) from non-selected areas when a memory cell array 11 is divided to a plurality of area. Each of the plurality of areas includes a plurality of non-volatile memory cells. The control circuit 15 sequentially performs the forming operations of all the non-volatile memory cells in the target area. The forming operation is performed in a unit of one bit or in a unit of predetermined a plurality of bits. Word lines WLi-WLj (i, j are a natural number equal to or larger than 1 and equal to or less than k) to which a bit to undergo the forming operation is connected is set to an L level, and bit lines BLa-BLb (a, b are a natural number equal to or larger than 1 and equal to or less than m) to which the bit to undergo the forming operation is connected is set to an H level. With this operation, a bias (first bias) which is in a forward direction to a diode D is applied to both the ends of the respective non-volatile memory cells in the areas. Then, resistance change elements VR in the respective non-volatile memory cells undergone the forming operations are placed in a low resistance state.

At step S22, the control circuit 15 applies a reverse bias to all the non-volatile memory cells in the target area at the same time. The reverse bias can be equivalent to (for example substantially the same as) the voltage necessary to the forming operation. More specifically, all the word lines corresponding to the target area are set to the H level, and all the bit lines corresponding to the target area is set to the L level. With the operation, a bias (second bias) which is in the reverse direction to the diode D is applied to both the ends of the respective non-volatile memory cells MC1, 1-MCk, m in the target area.

At step S23, the control circuit 15 determines whether or not a determination at step S3 is performed to all the non-volatile memory cells in the target area. When it is determined that the determination at step S3 is not performed to all the non-volatile memory cells in the target area ("No" at S23), a process is advanced to S3, whereas when it is determined that the determination at step S3 is performed to all the non-volatile memory cells in the target area ("Yes" at S23), the process is advanced to S24.

At step S24, the control circuit 15 determines whether or not processes at steps of S21 to S23 are performed to all the areas in the plurality of areas in the memory cell array 11. When it is determined that the processes at steps of S21 to S23 are not performed to all the areas ("No" at S24), the process is advanced to step S21, whereas when it is determined that the processes at steps of S21 to S23 are performed to all the areas ("Yes" at S24), the process is advanced to step S6.

Note that when the memory cell array 11 is divided to the plurality of areas, each area may include one non-volatile memory cell. Further, a process (forming operation) at step S21 to the target area and a process (reverse biasing operation) at step S22 to the other areas may be performed in parallel as well as step S22 to the target area may be omitted (i.e. step S22 to the other areas may substitute for step S22 to the target area). More specifically, a series of operations which apply the bias (first bias) which is in the forward direction to the diode D to both the ends of a non-volatile memory cell and thereafter apply the bias (second bias) which is in the reverse direction to the diode D to both the ends of the non-volatile memory cell are performed in parallel respective to a first non-volatile memory cell and a second non-volatile memory cell in the plurality of non-volatile memory cells MC1, 1-MCk, m. With the operation, it is possible to reduce a total process time for performing the series of operations which apply the bias (first bias) which is in the forward direction to the diode D to both the ends of the non-volatile memory cell and thereafter apply the bias (second bias) which is in the reverse direction to the diode D to both the ends of the non-volatile memory cell, as a whole.

Specifically, when each of the plurality of areas in the memory cell array 11 includes one non-volatile memory cell, the following process will be performed. That is, when word lines WL are sequentially selected, bit lines are sequentially selected in a period during which a predetermined word line WL is selected.

Figure 8A:
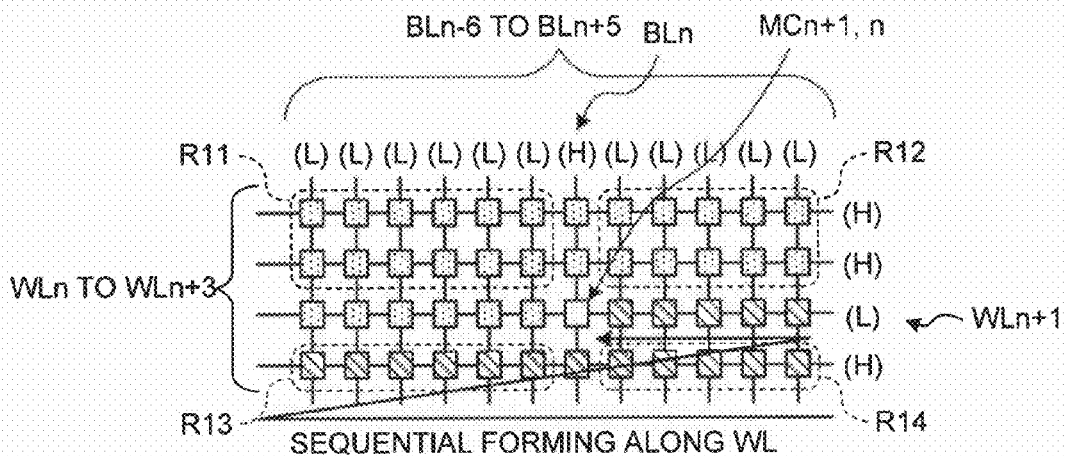
FIG. 8A and FIG. 8B are views showing a method of controlling the non-volatile semiconductor memory device according to the third embodiment.

For example, as shown in FIG. 8A, when a non-volatile memory cell MCn+1, n which is arranged at an intersecting portion of a word line WLn+1 and a bit line BLn undergo the forming operation as a target area, the word line WLn+1 is set to the L level and other word lines WLn, WLn+2, WLn+3 are set to the H level. Together with the operation, the bit line BLn is set to the H level, and other bit lines BLn−6-BLn−1, BLn+1-BLn+5 are set to the L level. At the time, an operation which applies the bias (first bias) for forming to both the ends of the non-volatile memory cell (first non-volatile memory cell) MCn+1, n as the target area, and an operation which applies the reverse bias (second bias) to both the ends of respective non-volatile memory cells (second non-volatile memory cells) included in regions R11 to R14 are performed in parallel. The region R11 includes non-volatile memory cells MCn+2, n−6 to MCn+2, n−1, MCn+3, n−6 to MCn+3, n−1. A region R12 includes non-volatile memory cells MCn+2, n+1 to MCn+2, n+5, MCn+3, n+1 to MCn+3, n+5. The region R13 includes non-volatile memory cells MCn, n−6 to MCn, n−1. The region R14 includes non-volatile memory cells MCn, n+1 to MCn, n+5.

Figure 8B:
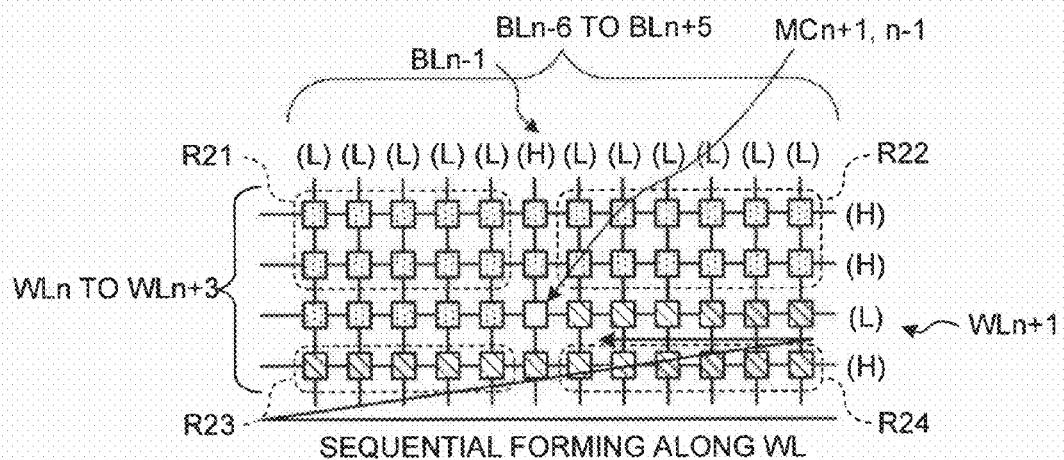

Thereafter, for example, as shown in FIG. 8B, when a non-volatile memory cell MCn+1, n−1 which is arranged in an intersecting portion of the word line WLn+1 and the bit line BLn−1 undergo the forming operation as a target area, the word line WLn+1 is set to the L level, and the other word lines WLn, WLn+2, WLn+3 are set to the H level. Together with the operation, the bit line BLn−1 is set to the H level, and other bit lines BLn−6 to BLn−2, BLn to BLn+5 are set to the L level. At the time, an operation which applies the bias (first bias) for forming to both the ends of a non-volatile memory cell (first non-volatile memory cell) MCn+1, n−1 as a target area, and an operation which applies the reverse bias (second bias) to both the ends of respective non-volatile memory cells (second non-volatile memory cells) included in regions R21 to R24, are performed in parallel. The region R21 includes non-volatile memory cells MCn+2, n−6 to MCn+2, n−2, MCn+3, n−6 to MCn+3, n−2. The region R22 includes non-volatile memory cells MCn+2, n to MCn+2, n+5, MCn+3, n to MCn+3, n+5. The region R23 includes non-volatile memory cells MCn, n−6 to MCn, n−2. The region R24 includes non-volatile memory cells MCn, n-MCn, n+5.

Figure 9:
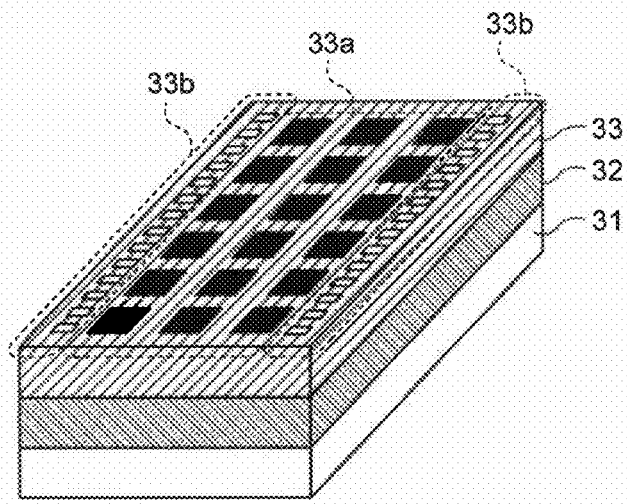
FIG. 9 is a schematic view showing a stacked structure of a non-volatile semiconductor memory device.

Note that in the non-volatile semiconductor memory devices according to the above-described embodiments of the first embodiment to the third embodiment, a CMOS layer 32 including a CMOS circuit is formed on a semiconductor substrate (for example, silicon substrate) 31 as shown in FIG. 9. A memory cell layer 33 including memory cells is formed on the CMOS layer 32.

Further, reference numeral 33a denotes a memory cell array area in which the memory cell array 11 (refer to FIG. 1) is arranged, and reference numeral 33b denotes an input/output (I/O) area. A peripheral circuit is fabricated in the CMOS layer 32.

The CMOS circuit is fabricated at a pitch wider than a pitch of word lines and bit lines in the memory cell layer 33, for example, by a 90 nm design rule except junctions to the memory cells. A size of the memory cell array area 33a is, for example, 22 μm×22 μm, and the memory cells (intersection points of the word lines and the bit lines) of, for example, 512×512 are fabricated in the memory cell array area 33a.

A portion (portion shown by a black square) corresponding to one non-volatile memory cell in the memory cell array area 33a is called a block. In the memory cell array area 33a, a plurality of blocks are arranged in a matrix state.

A predetermined electrode in the CMOS layer 32 and a predetermined electrode in the memory cell layer 33 are connected to each other by a through-hole plug.

In the non-volatile semiconductor memory device (resistive random access memory device), since the memory cell layer 33, on which a plurality of memory cells are stacked in an upward direction, can be fabricated on the CMOS layer 32, a large memory capacity can be secured without increasing a chip area.

Pads are fabricated in the input/output area 33b. In an assembly process, a lead frame is connected to a pad by, for example, a bonding wire.

The resistance change element VR (refer to FIG. 2B) in the memory cell is made of one material selected from a group of, for example, $ZnMn_2O_4$, NiO, HfO, $TiO_2$, $SrZrO_3$, $Pr_{0.7}Ca_{0.3}MnO_3$.

An electrode in contact with the resistance change element VR is made of, for example, TiN or TaN. Further, the electrode in contact with the resistance change element VR is made of, $TiO_2$ to which, for example, Pt, W, WN, Nb are doped.

The diode D connected in series to the resistance change element VR may be a PN-junction diode fabricated in the semiconductor substrate 31, or a SiGe alloy PN junction diode, a Schottky diode, and the like may be used in place of the PN-junction diode.

For example, a case that the resistance change element VR is made of, for example, 15 nm thick $ZnMn_2O_4$ will be examined. In the case, one end of the resistance change element VR is connected to a bit line made of W via an electrode made of, for example, TaN. The other end of the resistance change element VR is connected to a P-layer (anode layer) of a PN junction type (or PIN junction type) diode D in semiconductor substrate 31 via an electrode made of, for example, TiN (refer to FIG. 2B). An N-layer (cathode) of the PN junction type diode is connected to a word line made of W via an electrode made of, for example, TiN (refer to FIG. 2B).

The plurality of bit lines and the plurality of word lines have a pitch of 44 nm, respectively, that is, are composed of a line having a line width of 22 nm and a space of 22 nm. A plane size of the resistance change element VR is set to, for example, 22 nm×22 nm.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A non-volatile semiconductor memory device comprising:
   a memory cell array in which a plurality of memory cells are arranged, each of the plurality of memory cells having a resistance change element and a rectifying element connected in series to the resistance change element;
   a control circuit performing a series of operations to each of the plurality of memory cells and determining, as a defective memory cell, a memory cell whose data retention property does not satisfy a criteria, the series of operations including an operation applying a first bias to the memory cell in a forward direction of the rectifying element, and including an operation thereafter applying a second bias to the memory cell in a reverse direction of the rectifying element;
   a storage unit storing an address of the defective memory cell; and
   an address control unit performing a control to avoid storing data in the defective memory cell whose address is stored in the storage unit.

2. The non-volatile semiconductor memory device according to claim 1, wherein
   a magnitude of the second bias is equivalent to a magnitude of the first bias.

3. The non-volatile semiconductor memory device according to claim 1, wherein
   the address control unit performs a control to avoid reading data from the defective memory cell whose address is stored in the storage unit.

4. The non-volatile semiconductor memory device according to claim 1, wherein
   the control circuit performs a first operation which applies the first bias, sequentially to the plurality of memory cells in a unit of predetermined number, and performs a second operation which applies the second bias, at the same time to the plurality of memory cells after the first operations to all the plurality of memory cells have completed.

5. The non-volatile semiconductor memory device according to claim 4, wherein
   the unit of predetermined number is a unit of one bit or a unit of a plurality of bits.

6. The non-volatile semiconductor memory device according to claim 4, wherein
   the control circuit determines, in response to a value corresponding to a current value read from each of the plurality of memory cells, whether or not the current value is equal to or less than a threshold level, after the second operations to all the plurality of memory cells have completed.

7. The non-volatile semiconductor memory device according to claim 6, further comprising a detection circuit detecting a resistance value of a selected memory cell in the plurality of memory cells,
   wherein the control circuit selects one memory cell from the plurality of memory cells after the second operations to all the plurality of memory cells have completed,
   the detection circuit detects a resistance value of the memory cell selected by the control circuit, and
   the control circuit determines whether or not a current value read from the memory cell is equal to or less than the threshold level in response to the resistance value of the memory cell detected by the detection circuit.

8. The non-volatile semiconductor memory device according to claim 6, wherein
   the control circuit causes the storage unit to store an address of the memory cell as an address of the defective memory cell, when the control circuit determines that the current value read from the memory cell is equal to or less than the threshold level.

9. The non-volatile semiconductor memory device according to claim 1, wherein
   the control circuit performs the series of operations and a determination operation determining whether or not data retention property satisfies a criteria to each of the plurality of memory cells multiple times, and determines, as the defective memory cell, a memory cell whose data retention property is determined not to satisfy the criteria a threshold number of times or more.

10. The non-volatile semiconductor memory device according to claim 9, wherein
the control circuit stores a management table where an address of a memory cell corresponds to a number of times of the determination operations in which the data retention property of the memory cell does not satisfy the criteria, and updates, every time it is determined that the data retention property of the memory cell does not satisfy the criteria, the number of times of the determination operations corresponding to the memory cell in the management table.

11. The non-volatile semiconductor memory device according to claim 9, wherein
the storage unit stores a management table where an address of a memory cell corresponds to a number of times of the determination operations in which the data retention property of the memory cell does not satisfy the criteria, and
the control circuit updates, every time it is determined that the data retention property of the memory cell does not satisfy the criteria, the number of times of the determination operations corresponding to the memory cell in the management table.

12. The non-volatile semiconductor memory device according to claim 1, wherein
the plurality of memory cells are divided into a plurality of areas, each of the plurality of areas including at least one memory cell, and
the control circuit selects a target area from the plurality of areas and performs the series of operations to each of the target area.

13. The non-volatile semiconductor memory device according to claim 12, wherein
the control circuit performs a first operation which applies the first bias, sequentially to memory cells in the target area in a unit of predetermined number, and performs a second operation which applies the second bias, at the same time to all the memory cells in the target area, after the first operation to all the memory cells in the target area have completed.

14. The non-volatile semiconductor memory device according to claim 1, wherein
the control circuit performs the series of operations to a first memory cell and a second memory cell in the plurality of memory cells in parallel.

15. The non-volatile semiconductor memory device according to claim 13, wherein
the plurality of memory cells are divided into a plurality of areas, each of the plurality of areas including at least one memory cell, and
the control circuit selects a target area from the plurality of areas and performs, to the target area, a first operation which applies the first bias, and performs, to the other areas of the plurality of areas, a second operation which applies the second bias, in parallel with the first operation.

16. The non-volatile semiconductor memory device according to claim 1, wherein
the resistance change element is made of one material selected from a group of $ZnMn_2O_4$, NiO, HfO, $TiO_2$, $SrZrO_3$, $Pr_{0.7}Ca_{0.3}MnO_3$.

17. A method of controlling a non-volatile semiconductor memory device having a memory cell array and a storage unit, in the memory cell array a plurality of memory cells being arranged, each of the plurality of memory cells having a resistance change element and a rectifying element connected in series to the resistance change element, the method comprising:
applying a first bias to a memory cell in the memory cell array in a forward direction of the rectifying element;
applying a second bias to a memory cell in the memory cell array in a reverse direction of the rectifying element;
determining, as a defective memory cell, a memory cell whose data retention property does not satisfy a criteria after the application of the second bias; and
storing an address of the defective memory cell in the storage unit.

18. The method of controlling the non-volatile semiconductor memory device according to claim 17, wherein
the application of the first bias, the application of the second bias, and a determination whether or not a data retention property satisfies the criteria are performed to each of the plurality of memory cells multiple times, and
in the determination of the defective memory cell, a memory cell whose data retention property is determined not satisfy the criteria a threshold number of times or more is determined as the defective memory cell.

19. The method of controlling the non-volatile semiconductor memory device according to claim 17, wherein
the plurality of memory cells are divided into a plurality of areas, each of the plurality of areas including at least one memory cell, and
the application of the first bias, the application of the second bias, and the determination of the defective memory cell are performed to each target area selected from the plurality of areas.

20. The method of controlling the non-volatile semiconductor memory device according to claim 17, wherein
the application of the first bias to a first memory cell and the application of the second bias to a second memory cell in the plurality of memory cells are performed in parallel.

* * * * *